(12) United States Patent
Harriman

(10) Patent No.: US 9,733,283 B2
(45) Date of Patent: Aug. 15, 2017

(54) DC-DC CONVERTER LOAD CURRENT ESTIMATION CIRCUIT

(71) Applicant: SEMICONDUCTOR COMPONENTS INDUSTRIES, LLC, Phoenix, AZ (US)

(72) Inventor: Paul Jay Harriman, Belfair, WA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 151 days.

(21) Appl. No.: 14/693,994

(22) Filed: Apr. 23, 2015

(65) Prior Publication Data

US 2016/0315536 A1  Oct. 27, 2016

(51) Int. Cl.
| | | |
|---|---|---|
| G05F 1/00 | (2006.01) | |
| G01R 19/00 | (2006.01) | |
| H02M 3/156 | (2006.01) | |
| H02M 1/00 | (2006.01) | |

(52) U.S. Cl.
CPC ........ *G01R 19/0092* (2013.01); *H02M 3/156* (2013.01); *H02M 2001/0009* (2013.01); *H02M 2001/0019* (2013.01)

(58) Field of Classification Search
CPC .... H02M 3/156; H02M 3/158; G01R 19/0092
USPC .................................................. 323/282–286
See application file for complete search history.

(56) References Cited

U.S. PATENT DOCUMENTS

| | | | | |
|---|---|---|---|---|
| 6,249,447 B1* | 6/2001 | Boylan | ............... | G01R 19/0092 363/131 |
| 2008/0258701 A1* | 10/2008 | Liu | ...................... | H02M 3/1588 323/328 |
| 2009/0267580 A1* | 10/2009 | Derksen | ................ | H02M 3/158 323/282 |
| 2012/0098553 A1* | 4/2012 | Karlsson | ............ | G01R 27/2605 324/684 |
| 2012/0194161 A1* | 8/2012 | Latham, II | ............ | H02M 3/156 323/286 |
| 2015/0069990 A1* | 3/2015 | Feldtkeller | ............ | H02M 3/158 323/284 |

OTHER PUBLICATIONS

Angel V. Peterchev et al., "Design of Ceramic-Capacitor VRM's with Estimated Load Current Feedforward", 2004 35th Annual IEEE Power Electronics Specialists Coference, pp. 4325-4332.*

(Continued)

*Primary Examiner* — Alex Torres-Rivera
(74) *Attorney, Agent, or Firm* — Conley Rose, P.C.

(57) ABSTRACT

A method for estimating load current in a DC-DC converter, in some embodiments, comprises: identifying a converter capacitor in parallel with a converter load in a DC-DC converter; providing an estimation capacitor based on a capacitance of the converter capacitor; providing said estimation capacitor with an estimation capacitor current based on an inductor current flowing through an inductor in the DC-DC converter; driving an estimation voltage across the estimation capacitor toward a voltage present across the converter capacitor; and using the estimation voltage to generate an estimation current that estimates a load current passing through said converter load.

20 Claims, 2 Drawing Sheets

(56) References Cited

OTHER PUBLICATIONS http://hades.mech.northwestern.edu/index.php/Resistors_(Ohm's_Law),_Capacitors,_and_Inductors, "Resistors (Ohm's Law), Capacitors, and Inductors", Jul. 25, 2006, pp. 1-6.*

IEC Chesapeake WECA, Electrical Pre-Apprenticeship & Workforce Development Manual, Cengage Learning, Jan. 8, 2012, p. 153.*

Chaniotakis and Cory, Circuit Analysis using the Node and Mesh Methods, Spring 2006, pp. 1-20.*

* cited by examiner

DC-DC CONVERTER LOAD CURRENT ESTIMATION CIRCUIT

BACKGROUND

A direct current (DC)-DC converter is typically used to step down a power supply voltage to meet the needs of a particular circuit. In many instances, such circuits have variable loads—for example, in DC motors, which are found in innumerable types of electronic products, from medical equipment to automobiles. To conserve power while maintaining the proper voltage supply to the variable load, DC-DC converters often employ pulse width modulation (PWM), in which an input voltage that is rapidly switched on and off is applied to an output filter to regulate the voltage and current supplied to the load in an efficient manner. A PWM controller is used to control this switching operation. Many such controllers (e.g., current mode controllers) monitor the current flowing through a converter output inductor and use the inductor current signal as part of a feedback loop to improve the stability of the PWM control system.

Current mode controllers have improved stability relative to other types of controllers. However, they respond slowly to changes in the load current. This slow response results in deviations in the voltage supplied to the load. It is therefore desirable to maintain the superior stability of current mode control systems while improving the response time to changes in the load. This can be accomplished with the load current feed forward control method. Available load current feed forward control methods entail the sensing of load current using a series impedance between the output filter capacitor and the load. This approach is disadvantageous, however, because the impedance can produce added power loss and interfere with the voltage regulation to the load. A simple, lossless, non-interfering method of estimating the output current is therefore desired.

SUMMARY

At least some of the embodiments disclosed herein are directed to a method for estimating load current in a DC-DC converter, comprising: identifying a converter capacitor in parallel with a converter load in a DC-DC converter; providing an estimation capacitor based on a capacitance of the converter capacitor; providing said estimation capacitor with an estimation capacitor current based on an inductor current flowing through an inductor in the DC-DC converter; driving an estimation voltage across the estimation capacitor toward a voltage present across the converter capacitor; and using the estimation voltage to generate an estimation current that estimates a load current passing through said converter load. At least some of these embodiments may be modified in one or more ways, such as to include any or all of the following concepts, in any order and in any combination: wherein a first ratio of the capacitance of the converter capacitor to a capacitance of the estimation capacitor is equal to a second ratio of the estimation current to the load current; wherein a first ratio of the estimation capacitor current flowing to the estimation capacitor to a current flowing to the converter capacitor is equal to a second ratio of the estimation current to the load current; wherein the estimation capacitor current flowing to the estimation capacitor as a function of time is equal to a capacitance of the estimation capacitor multiplied by a rate of change of the estimation voltage; wherein driving said estimation voltage comprises providing the estimation voltage and a load voltage across said converter load to an operational transconductance amplifier that produces said estimation current; further comprising using the estimation current to drive a pulse width modulation (PWM) controller that controls the DC-DC converter; wherein using the estimation current to drive the PWM controller results in a faster response of the PWM controller to a change in said converter load than a response produced by a PWM controller voltage feedback loop.

At least some embodiments are directed to a system, comprising: an estimation capacitor associated with a converter capacitor in a DC-DC converter, said estimation capacitor receives an estimation capacitor current based on an inductor current passing through an inductor in the DC-DC converter; and an amplifier, coupled to the estimation capacitor, that receives a load voltage present across a converter load in the DC-DC converter and that receives an estimation voltage present across the estimation capacitor, wherein the amplifier generates an estimation current that estimates a load current passing through said load. At least some of these embodiments may be modified in one or more ways, such as to include any or all of the following concepts, in any order and in any combination: further comprising another amplifier that is used to provide said estimation capacitor current based on the inductor current passing through said inductor in the DC-DC converter; wherein an output of said another amplifier couples to a node, wherein an input to said amplifier couples to the node, and wherein said estimation capacitor couples to the node; wherein an output of said amplifier couples to said node via a feedback loop; wherein another input to said amplifier couples to said converter load; wherein the DC-DC converter is a buck converter.

At least some embodiments are directed to a system, comprising: a DC-DC converter that includes an inductor coupled to a converter capacitor and a converter load, said converter capacitor and said converter load coupled in parallel; a first differential amplifier, coupled to the inductor, that senses an inductor current passing through the inductor; an estimation capacitor, coupled to the first differential amplifier, that has a capacitance based on a capacitance of said converter capacitor, an estimation capacitor current passing to the estimation capacitor based on an output current of the first differential amplifier; and a second differential amplifier, coupled to the first differential amplifier and the estimation capacitor, that drives an estimation voltage across the estimation capacitor toward a load voltage present across said converter load, wherein the second differential amplifier generates an estimation current based on the load voltage and the estimation voltage to estimate a load current passing through said converter load. At least some of these embodiments may be modified in one or more ways, such as to include any or all of the following concepts, in any order and in any combination: wherein an output of the first differential amplifier, an input to the second differential amplifier, and said estimation capacitor all connect at a common node; wherein each of the first and second differential amplifiers is selected from the group consisting of operational amplifiers and operational transconductance amplifiers; wherein the system uses the estimation current to drive a pulse width modulation (PWM) controller that controls the DC-DC converter; wherein a first ratio of the estimation current to the load current is equal to a second ratio of the estimation capacitor current to a current flowing to said converter capacitor; wherein the estimation capacitor current as a function of time is equal to the capacitance of the estimation capacitor multiplied by a rate of change of the estimation voltage; wherein the DC-DC converter is a buck converter.

BRIEF DESCRIPTION OF THE DRAWINGS

There are disclosed in the drawings and in the following description an estimation circuit that estimates a load current in a DC-DC converter. In the drawings.

Figure 1:
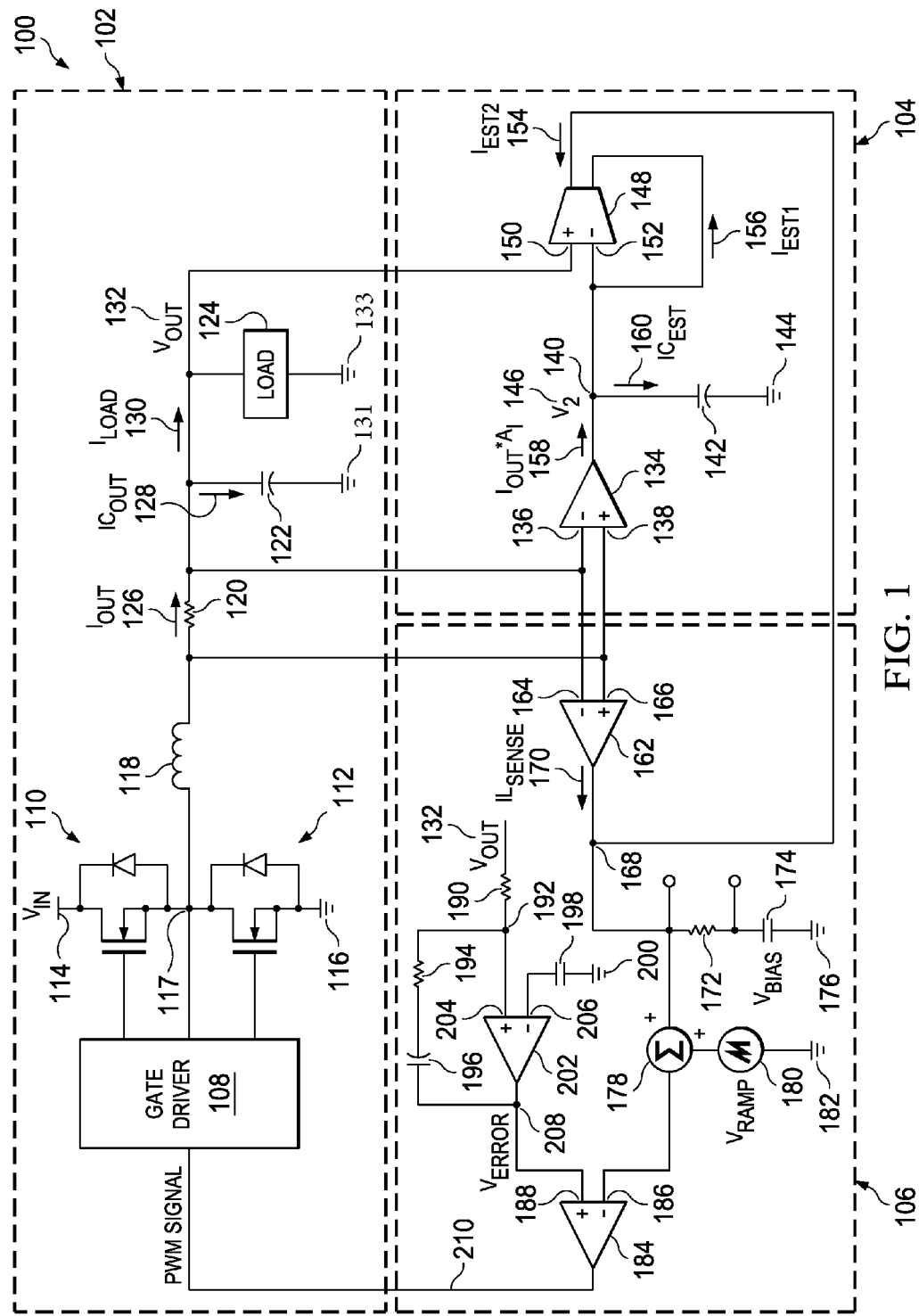
FIG. 1 is a schematic diagram of an illustrative estimation circuit coupled to a DC-DC buck converter and a pulse width modulation (PWM) controller.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein is an estimation circuit that may be used to estimate the load current in a DC-DC converter. The estimation circuit estimates the load current using signals that are typically already available to the pulse width modulation (PWM) controller that controls the switching operation of the DC-DC converter. Specifically, the estimation circuit includes an estimation capacitor that is a scaled-down version of a converter capacitor in the DC-DC converter. The estimation circuit uses amplifiers (e.g., operational transconductance amplifiers (OTAs)) to provide a scaled-down version of the DC-DC converter's inductor filter current to the estimation capacitor in the estimation circuit. The ratio of the estimation capacitor capacitance and the DC-DC converter capacitor capacitance is the same or substantially similar to the ratio of the estimation capacitor current and the inductor filter current. The estimation voltage across the estimation capacitor and the load voltage across the DC-DC converter load are provided to an amplifier (e.g., OTA), which produces the estimation current. The estimation current forces the estimation voltage to match or be a predetermined ratio of the load voltage in the DC-DC converter, where the estimation current estimates the load current in the DC-DC converter. The PWM controller subsequently uses the estimation current to control the converter switching operation. The estimation circuit and the PWM controller's use of the estimation current produces a faster transient response to changes in the converter load than typically achieved by current mode PWM controllers.

FIG. 1 is a schematic diagram of a system 100 including a DC-DC buck converter 102, an illustrative estimation circuit 104 and a pulse width modulation (PWM) controller 106, all of which couple to each other. The structure of the system 100 is described first, followed by a description of the operation of the system 100. The DC-DC converter 102 includes a gate driver 108; transistor-based switches 110, 112; a $V_{IN}$ rail voltage supply 114 coupling to switch 110 and ground 116 coupling to switch 112; a node 117 at which switches 110, 112 couple to each other; an inductor 118 coupled to node 117; a sense resistor 120 coupled to the inductor 118; a converter capacitor 122 coupled to the sense resistor 120; and a variable converter load 124 coupled to the converter capacitor 122 and the sense resistor 120. An inductor current $I_{OUT}$ 126 flows through the inductor 118 and the sense resistor 120; a current $IC_{OUT}$ 128 flows to the converter capacitor 122; a load current $I_{LOAD}$ 130 flows through the converter load 124; a load voltage $V_{OUT}$ 132 is present across the converter load 124; ground 131 couples to the converter capacitor 122; and ground 133 couples to the converter load 124. The scope of this disclosure is not limited to the specific arrangement of circuit logic shown in the illustrative DC-DC buck converter 102, nor are the techniques disclosed herein limited to use with a buck converter. To the contrary, the disclosed estimation circuit may be used in conjunction with any suitable type of current-mode-controlled DC-DC converter.

The illustrative estimation circuit 104 includes an amplifier (e.g., an operational transconductance amplifier (OTA)) 134 having a non-inverting input 138 and an inverting input 136; a node 140 that couples to an output of the amplifier 134; an estimation capacitor 142 that couples to the node 140; and another amplifier (e.g., an OTA) 148 that has an inverting input 152 that couples to node 140. The amplifier 148 further includes a non-inverting input 150 that couples to load 124 in the DC-DC converter 102. The amplifier 148 produces two identical or nearly identical outputs, one of which couples to the node 140 as a feedback loop, and the other of which couples to the PWM controller 106 as described below. The output of the amplifier 134 produces a current 158; an estimation capacitor current $IC_{EST}$ 160 flows to the estimation capacitor 142; an estimation current $I_{EST}$ 156 flows through the feedback loop that connects the amplifier 148 to node 140; an estimation current $I_{EST2}$ 154 (identical to $I_{EST}$ 156) flows between the amplifier 148 and the PWM controller 106; and an estimation voltage $V_2$ 146 is present across the estimation capacitor 142. The estimation capacitor 142 couples to ground 144.

Parameters for the amplifiers 134, 148 and the estimation capacitor 142 are chosen based on parameters for various components in the DC-DC converter 102. Specifically, the capacitance ratio of the estimation capacitor 142 to the converter capacitor 122 is referred to herein as $A_I$, and the current ratio of the estimation current $I_{EST2}$ 154 (or, equivalently, estimation current 156) to the load current $I_{LOAD}$ 130 is also $A_I$. Similarly, the current ratio of the estimation capacitor current 160 to the current 128 flowing to the converter capacitor 122 is $A_I$, and the current 158 is equivalent to the product of the inductor current $I_{OUT}$ 126 and $A_I$. The value of $A_I$ may be chosen as desired and as may be suitable. In at least some embodiments, however, the value of $A_I$ is chosen to be in the range of 0.00001 to 0.001, although the scope of disclosure is not limited to this or any other particular value or range of values. Achieving $A_I$ as the capacitance ratio of the estimation capacitor 142 to the converter capacitor 122 is done by selecting capacitors 122, 142 with the appropriate capacitance parameters. Achieving $A_I$ for the aforementioned current ratios is accomplished by selecting the amplifiers 134, 148 with the appropriate gain values. Not all ratios described above need be precisely equal to $A_I$. A suitable degree of error among ratios may be permitted by a circuit designer as appropriate. In at least some embodiments, this degree of error may be plus or minus 5 percent. The scope of this disclosure is not limited to the specific arrangement of circuit logic shown in the estimation circuit 104 of FIG. 1.

The PWM controller 106 includes an amplifier (e.g., an OTA) 162 having inverting input 164 and non-inverting input 166. The amplifier 162 outputs a current $IL_{SENSE}$ 170 to node 168, which, in turn, couples to an output of the amplifier 148 on which $I_{EST2}$ 154 flows. The PWM controller 106 further includes a resistor 172 coupled to the node 168 and to a bias voltage source 174. The bias voltage source 174, in turn, couples to ground 176. The node 168 further couples to a summation block 178, which, in turn, couples to a ramp voltage source 180 and ground 182. The output of the summation block 178 couples to the inverting input 186 of a comparator 184. The non-inverting input of the comparator 184 couples to the output of a voltage feedback loop. The voltage feedback loop includes a resistor 190 that receives the load voltage $V_{OUT}$ 132; a node 192 that couples to the resistor 190, to an inverting input 204 of an amplifier (e.g., operational amplifier) 202, and to a feedback loop that includes a resistor 194 coupled to a capacitor 196; a node 208 coupled to the output of the amplifier 202 and to the feedback loop including the resistor 194 and capacitor 196; and a reference voltage source 198 that provides a reference voltage $V_{REF}$ to the non-inverting input 206 of the amplifier 202 and couples to ground 200. The node 208 provides an error signal $V_{ERROR}$ to the non-inverting input 188 of the comparator 184. The output of the comparator 184 is a PWM control signal 210 that is provided to the gate driver 108 and that controls the operation of the gate driver 108, thus controlling the voltage provided to the converter load 124. The scope of disclosure is not limited to the specific arrangement of circuit logic shown in the PWM controller 106 of FIG. 1.

The general operation of the system 100 is now described. The gate driver 108, which is controlled using the PWM signal 210, opens and closes the switches 110, 112 to regulate the voltage provided to the load 124. Inductor current $I_{OUT}$ 126 passes through the node 117, the inductor 118 and the resistor 120. The inductor current $I_{OUT}$ 126 then splits into two separate currents: the current $IC_{OUT}$ 128 that flows to the converter capacitor 122, and the load current $I_{LOAD}$ 130 that flows to the load 124. A load voltage $V_{OUT}$ 132 is generated across the load 124, and the same voltage is generated across the converter capacitor 122 since the load 124 and the converter capacitor 122 are coupled in parallel.

The voltage present across the resistor 120 is converted to a current 158 by the amplifier 134. The current 158, which is produced at node 140, has a gain of $A_I$. In at least some embodiments, $A_I$ is less than one, meaning that the current 158 is a scaled-down version of the current $I_{OUT}$ 126. From node 140, the estimation capacitor current $IC_{EST}$ 160 flows toward the estimation capacitor 142. The estimation voltage $V_2$ 146 present across the estimation capacitor 142 is provided to the inverting input 152 of the amplifier 148, and the load voltage $V_{OUT}$ 132 is provided to the non-inverting input 150 of the amplifier 148. The amplifier has two outputs, each of which carries an estimation current $I_{EST}$ 156 or $I_{EST2}$ 154. The output carrying $I_{EST}$ 156 couples to the node 140 in a feedback loop.

One aim of the estimation circuit 104 is to use readily available signals from the DC-DC converter 102 to mimic conditions at the converter capacitor 122 and converter load 124. The estimation circuit 104 thus produces an estimation current $I_{EST2}$ 154 that is a substantially accurate estimation of the actual load current $I_{LOAD}$ 130, and the estimation current $I_{EST2}$ 154 is used by the PWM controller 106 to control switching operations in the DC-DC converter 102. To this end, the estimation capacitor 142 is a scaled-down version of the converter capacitor 122. The amplifiers 134, 148 are used to regulate the voltage and current that are applied to this estimation capacitor 142. Specifically, the current $IC_{EST}$ 160 flowing to the estimation capacitor 142 is a scaled-down version of the current $IC_{OUT}$ 128 flowing to the converter capacitor 122, and the amplifier 148 uses the feedback loop on which $I_{EST}$ 156 is carried to drive the estimation voltage $V_2$ 146 toward the load voltage $V_{OUT}$ 132. The net effect of these activities is that the estimation voltage $V_2$ 146 matches or nearly matches the load voltage $V_{OUT}$ 132, thus providing the same voltage across the estimation capacitor 142 as that present across the converter capacitor 122; and that the estimation capacitor current $IC_{EST}$ 160 passing to the estimation capacitor 142 is a scaled-down version of the current $IC_{OUT}$ 128 passing to the converter capacitor 122. (The estimation capacitor current $IC_{EST}$ 160, expressed as a function of time, is equal to the estimation capacitor capacitance multiplied by the rate of change of the estimation voltage $V_2$ 146, assuming that the estimation voltage $V_2$ 146 is equal to or closely approximates load voltage $V_{OUT}$ 132.) Based on these conditions, the amplifier 148 produces the substantially identical estimation currents $I_{EST}$ 156 and $I_{EST2}$ 154, both of which may be scaled-down estimates of the current $I_{LOAD}$ 130.

Referring now to the PWM controller 106, the amplifier 162—like the amplifier 134—amplifies the voltage across the resistor 120 and produces the current $IL_{SENSE}$ 170 to node 168. The difference between $IL_{SENSE}$ 170 and the estimation current $I_{EST2}$ 154 flows to the resistor 172. The voltage across the resistor 172 is thus the product of the resistance of resistor 172 and the difference between $IL_{SENSE}$ 170 and $I_{EST2}$ 154. A suitable bias voltage may be introduced by bias voltage source 174. The summation block 178 combines the potential across the resistor 172 and the ramp signal produced by voltage source 180 to produce an output signal that is provided to the inverting input 186 of the comparator 184. The non-inverting input 188 of the comparator 184 is provided a signal $V_{ERROR}$ from node 208, which is produced as follows. The load voltage $V_{OUT}$ 132 is provided to resistor 190. The voltage at node 192 is provided to inverting input 204 of the amplifier 202, the non-inverting input 206 being coupled to a reference voltage source 198. The node 192 couples to the output of the amplifier 202 via the feedback loop containing resistor 194 and capacitor 196. The comparator 184 compares the signal received from node 208 to the signal received from the summation block 178. The output 210 of the comparator 184 is provided to the gate driver 108, which operates as described above. One advantage to using the estimation circuit 104 is that a change in the load 124 results in a change in the voltage across resistor 172, which rapidly alters the PWM on time faster and more substantially than the signal $V_{ERROR}$ can. Thus, the estimation circuit 104 provides superior transient responses to changes in the load 124. Although the parameters of the components in the estimation circuit 104 and DC-DC converter 102 are described in detail herein, the parameters of the components in the PWM controller 106 are not, as they may be appropriately selected as desired by one of ordinary skill in the art.

Figure 2:
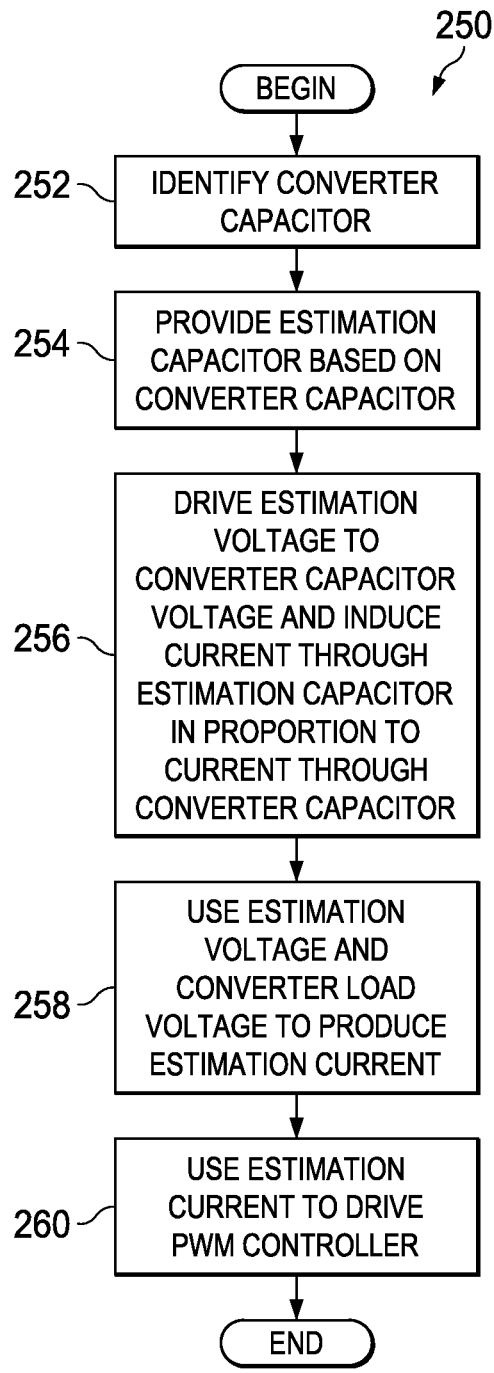
FIG. 2 is a flow diagram of an illustrative method to estimate the load current in a DC-DC converter in accordance with embodiments.

FIG. 2 is a flow diagram of an illustrative method 250 to estimate the load current in a DC-DC converter in accordance with embodiments. The method 250 begins by identifying the converter capacitor (step 252) and providing an estimation capacitor based on the converter capacitor (step 254). As explained above, these capacitors may be selected as desired, with the ratio $A_I$ of the estimation capacitor capacitance to the converter capacitor capacitance also being the ratio of the currents to these capacitors and the ratio of the estimation current produced by the estimation circuit to the load current in the DC-DC converter circuit. The method 250 then includes driving the estimation voltage across the estimation capacitor to the converter capacitor voltage (i.e., the load voltage) and inducing an estimation capacitor current to the estimation capacitor in proportion (i.e., the value $A_I$) to the current to the converter capacitor (step 256). In this way, the voltage and current conditions associated with the converter capacitor 122 are mimicked for the estimation capacitor 142. The method 250 next includes using the estimation voltage that is present across the estimation capacitor and the converter load voltage to produce an estimation current (step 258). As explained, the estimation current is an estimation (e.g., a scaled-down version) of the load current $I_{LOAD}$ 130. The estimation current is then used to drive the PWM controller (step 260).

Numerous other variations and modifications will become apparent to those skilled in the art once the above disclosure is fully appreciated. It is intended that the following claims be interpreted to embrace all such variations, modifications and equivalents. In addition, the term "or" should be interpreted in an inclusive sense.

What is claimed is:

1. A method for estimating a load current in a DC-DC converter, comprising:
    identifying a converter capacitor in parallel with a converter load in the DC-DC converter;
    providing an estimation capacitor based on a capacitance of the converter capacitor;
    providing said estimation capacitor with an estimation capacitor current based on an inductor current flowing through an inductor in the DC-DC converter;
    driving an estimation voltage across the estimation capacitor toward a voltage present across the converter capacitor, the estimation voltage driven from a first node and the voltage across the converter capacitor present at a second node different from the first node; and
    using the estimation voltage to generate an estimation load current that estimates the load current passing through said converter load.

2. The method of claim 1, wherein a first ratio of the capacitance of the converter capacitor to a capacitance of the estimation capacitor is equal to a second ratio of the estimation load current to the load current.

3. The method of claim 1, wherein a first ratio of the estimation capacitor current flowing to the estimation capacitor to a current flowing to the converter capacitor is equal to a second ratio of the estimation load current to the load current.

4. The method of claim 1, wherein the estimation capacitor current flowing to the estimation capacitor as a function of time is equal to a capacitance of the estimation capacitor multiplied by a rate of change of the estimation voltage.

5. The method of claim 1, wherein driving said estimation voltage comprises providing the estimation voltage and a load voltage across said converter load to an operational transconductance amplifier that produces said estimation load current.

6. The method of claim 1, further comprising using the estimation load current to drive a pulse width modulation (PWM) controller that controls the DC-DC converter.

7. The method of claim 6, wherein using the estimation load current to drive the PWM controller results in a faster response of the PWM controller to a change in said converter load than a response produced by a PWM controller voltage feedback loop.

8. A system, comprising:
    an estimation capacitor associated with a converter capacitor in a DC-DC converter, said estimation capacitor receives an estimation capacitor current based on an inductor current passing through an inductor in the DC-DC converter; and
    a first amplifier coupled to the estimation capacitor, the first amplifier receives a load voltage present across a converter load in the DC-DC converter and receives an estimation voltage present across the estimation capacitor, wherein the first amplifier generates an estimation load current that estimates a load current passing through said load.

9. The system of claim 8, further comprising a second amplifier that is used to provide said estimation capacitor current based on the inductor current passing through said inductor in the DC-DC converter.

10. The system of claim 9, wherein an output of said second amplifier couples to a node, wherein an input to said first amplifier couples to the node, and wherein said estimation capacitor couples to the node.

11. The system of claim 10, wherein an output of said first amplifier couples to said node via a feedback loop.

12. The system of claim 10, wherein another input to said first amplifier couples to said converter load.

13. The system of claim 8, wherein the DC-DC converter is a buck converter.

14. A system, comprising:
    a DC-DC converter that includes an inductor coupled to a converter capacitor and a converter load, said converter capacitor and said converter load coupled in parallel;
    a first differential amplifier coupled to the inductor, the first differential amplifier senses an inductor current passing through the inductor;
    an estimation capacitor coupled to the first differential amplifier, the estimation capacitor has a capacitance based on a capacitance of said converter capacitor, an estimation capacitor current passing to the estimation capacitor based on an output current of the first differential amplifier; and
    a second differential amplifier coupled to the first differential amplifier and the estimation capacitor, the second differential amplifier drives an estimation voltage across the estimation capacitor toward a load voltage present across said converter load,
    wherein the second differential amplifier generates an estimation load current based on the load voltage and the estimation voltage to estimate a load current passing through said converter load.

15. The system of claim 14, wherein an output of the first differential amplifier, an input to the second differential amplifier, and said estimation capacitor all connect at a common node.

16. The system of claim 14, wherein each of the first and second differential amplifiers is selected from the group consisting of operational amplifiers and operational transconductance amplifiers.

17. The system of claim 14, wherein the system uses the estimation load current to drive a pulse width modulation (PWM) controller that controls the DC-DC converter.

18. The system of claim 14, wherein a first ratio of the estimation load current to the load current is equal to a second ratio of the estimation capacitor current to a current flowing to said converter capacitor.

19. The system of claim 14, wherein the estimation capacitor current as a function of time is equal to the capacitance of the estimation capacitor multiplied by a rate of change of the estimation voltage.

20. The system of claim 14, wherein the DC-DC converter is a buck converter.

\* \* \* \* \*